(12) United States Patent
Chu et al.

(10) Patent No.: US 8,546,165 B2
(45) Date of Patent: Oct. 1, 2013

(54) FORMING LIGHT-EMITTING DIODES USING SEED PARTICLES

(75) Inventors: Jung-Tang Chu, Zhunan Township (TW); Ching-Hua Chiu, Hsinchu (TW); Hung-Wen Huang, Hsinchu (TW); Yea-Chen Lee, Zhubei (TW); Hsing-Kuo Hsia, Jhubei (TW)

(73) Assignee: TSMC Solid State Lighting Ltd., Hsinchu (TW)

( * ) Notice: Subject to any disclaimer, the term of this patent is extended or adjusted under 35 U.S.C. 154(b) by 111 days.

(21) Appl. No.: 13/227,905

(22) Filed: Sep. 8, 2011

(65) Prior Publication Data

US 2012/0104409 A1    May 3, 2012

Related U.S. Application Data

(60) Provisional application No. 61/409,212, filed on Nov. 2, 2010.

(51) Int. Cl.
*H01L 21/00* (2006.01)
*H01L 29/20* (2006.01)
*H01L 33/32* (2010.01)

(52) U.S. Cl.
USPC ............... 438/46; 438/26; 438/455; 438/458

(58) Field of Classification Search
USPC ........................... 438/46, 458; 257/E21.001
See application file for complete search history.

(56) References Cited

U.S. PATENT DOCUMENTS

| 5,371,379 | A | * | 12/1994 | Narusawa | 257/14 |
|---|---|---|---|---|---|
| 5,608,229 | A | * | 3/1997 | Mukai et al. | 257/14 |
| 6,639,354 | B1 | * | 10/2003 | Kojima et al. | 313/498 |
| 2005/0048685 | A1 | * | 3/2005 | Shibata | 438/46 |
| 2008/0237628 | A1 | * | 10/2008 | Satoh et al. | 257/103 |
| 2011/0053303 | A1 | * | 3/2011 | Kim et al. | 438/46 |

* cited by examiner

*Primary Examiner* — Angel Roman
(74) *Attorney, Agent, or Firm* — Haynes and Boone, LLP

(57) ABSTRACT

A seed layer for growing a group III-V semiconductor structure is embedded in a dielectric material on a carrier substrate. After the group III-V semiconductor structure is grown, the dielectric material is removed by wet etch to detach the carrier substrate. The group III-V semiconductor structure includes a thick gallium nitride layer of at least 100 microns or a light-emitting structure.

20 Claims, 6 Drawing Sheets

FORMING LIGHT-EMITTING DIODES USING SEED PARTICLES

CROSS-REFERENCE TO RELATED APPLICATIONS

The present application claims priority of U.S. Provisional Patent Application Ser. No. 61/409,212, filed on Nov. 2, 2010, which is incorporated herein by reference in its entirety.

FIELD OF THE INVENTION

The present disclosure relates generally to methods for making a group III-V semiconductor structure and, more particularly, to methods for making light-emitting diodes (LEDs).

BACKGROUND

A Light-Emitting Diode (LED), as used herein, is a semiconductor light source for generating light at a specified wavelength or a range of wavelengths. LEDs are traditionally used for indicator lamps, and are increasingly used for displays. An LED emits light when a voltage is applied across a p-n junction formed by oppositely doping semiconductor compound layers. Different wavelengths of light can be generated using different materials by varying the bandgaps of the semiconductor layers and by fabricating an active layer within the p-n junction. Additionally, an optional phosphor material changes the properties of light generated by the LED.

Traditionally, LEDs are made by growing a plurality of light-emitting structures on a growth substrate, usually sapphire. The light-emitting structures along with the underlying sapphire are separated into individual LED dies and packaged separately. The inclusion of sapphire with the packaged LED is a significant portion of the overall material cost. In some cases, the sapphire substrate is first separated from the light-emitting structure by a laser liftoff process; however, the reusability of the sapphire substrate is limited and the process can damage the light-emitting structure.

Continued development in LEDs has resulted in efficient and mechanically robust light sources that can cover the visible spectrum and beyond. These attributes, coupled with the potentially long service life of solid state devices, may enable a variety of new display applications, and may place LEDs in a position to compete with the well entrenched incandescent and fluorescent lamps. However, improvements in manufacturing processes to reduce the cost of making LEDs continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
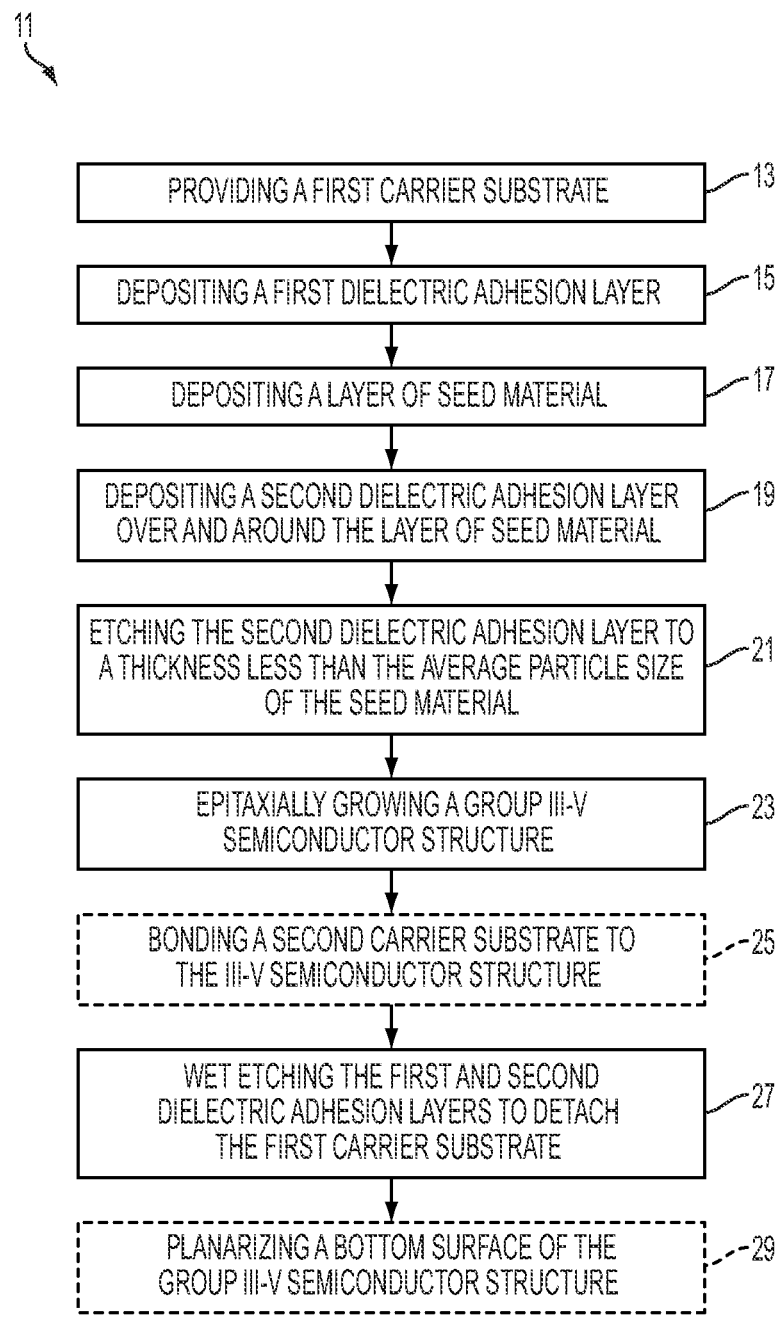
FIG. 1 is a flowchart illustrating method embodiments of fabricating a Light-Emitting Diode (LED) according to various aspects of the present disclosure.

It is understood that the following disclosure provides many different embodiments, or examples, for implementing different features of various embodiments. Specific examples of components and arrangements are described below to simplify the present disclosure. These are merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

An LED may be a part of a display or lighting device having a number of the LEDs, the LEDs either controlled singly or in combination. The LED may also be a part of an integrated circuit (IC) chip, system on chip (SoC), or portion thereof, that may include various passive and active microelectronic devices such as resistors, capacitors, inductors, diodes, metal-oxide semiconductor field effect transistors (MOSFETs), complementary metal-oxide semiconductor (CMOS) transistors, bipolar junction transistors (BJTs), laterally diffused MOS (LDMOS) transistors, high power MOS transistors, or other types of transistors.

Illustrated in FIG. 1 is a flowchart of method 11 for fabricating a Light-Emitting Diode (LED) in accordance with the present disclosure. It is understood that various figures have been simplified for a better understanding of the inventive concepts of the present disclosure. Accordingly, it should be noted that additional processes may be provided before, during, and after the operations of FIG. 1 that some other processes may only be briefly described, and various processes may be substituted for the described processes to achieve the same effect.

Figure 2:
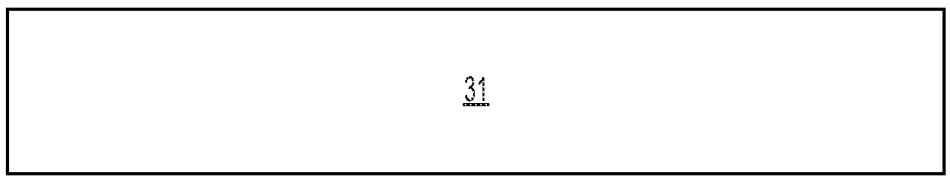
FIGS. 2-10 illustrate various views of the LED at various stages of fabrication according to certain embodiments of the present disclosure.

Referring to FIG. 1, the method 11 begins with block 13 in which a first carrier substrate is provided, shown as element 31 in FIG. 2. The substrate is a material suitable for depositing a first dielectric adhesion layer and mechanically supporting subsequent semiconductor forming operations such as epitaxial growth operations that subject the first carrier substrate and all materials thereon to a very high temperature. The very high temperature may be greater than 1000 degrees Celsius.

In various embodiments, the substrate is silicon, which has a much lower material cost than sapphire (aluminum oxide), gallium nitride, or silicon carbide. Other suitable first carrier substrates include sapphire, gallium nitride, and silicon carbide. The first carrier substrate need not be a substrate that is suitable for growing a light-emitting structure, such as sapphire, gallium nitride, or silicon carbide, although any of these substrates may be used. Light-emitting structures used in LEDs known to the inventors are epitaxially grown on growth substrates that are typically limited to sapphire, gallium nitride, or silicon carbide due to smaller crystal lattice constant mismatches as compared to other growth substrate candidates. In some processes, the growth substrates can be recycled for a limited number of times while in other processes, the growth substrates are diced along with the light-emitting structure for packaging. Even with limited recycling, the growth substrates contribute significantly to the overall material cost of the LED product. One particular feature of the embodiments of the present disclosure pertains to forming the light-emitting structure in such a way to enable theoretically limitless recycling of the first carrier substrate, thereby removing its material cost from the cost of the LED product.

Figure 3:
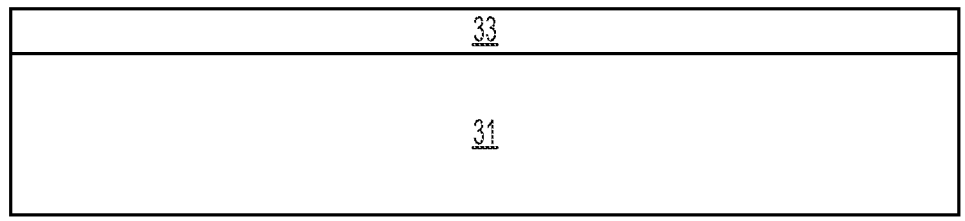

In operation 15 of FIG. 1, a first dielectric adhesion layer is deposited on the first carrier substrate. FIG. 3 illustrates a dielectric adhesion layer 33 on the first carrier substrate 31. The dielectric adhesion layer 33 may be silicon oxide, silicon nitride, silicon oxynitride, or other suitable material that adequately adheres to the first carrier substrate 31 and to seed layer particles and can be easily wet etched in a subsequent operation with very good etch selectivity against the first carrier substrate 31 and the light-emitting structure material.

The dielectric adhesion layer 33 may be deposited in a number ways including chemical vapor deposition (CVD), thermal deposition, or spin-coating. An example of a suitable process is plasma enhanced CVD (PECVD) for depositing silicon nitride or silicon oxide. In some embodiments, the dielectric adhesion layer 33 deposited is up to about 4 microns thick.

Figure 4A:
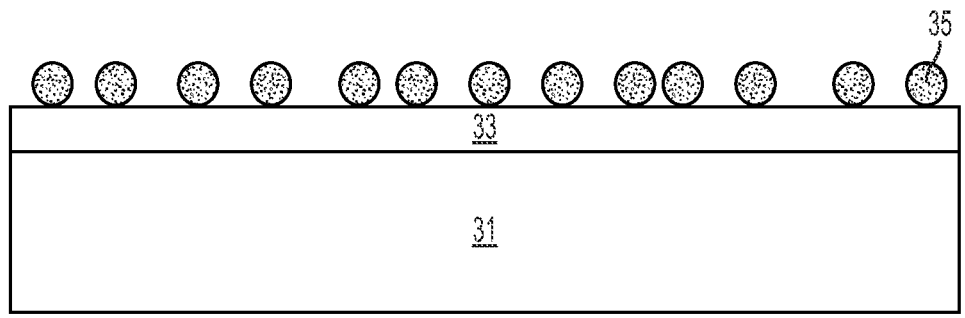
Figure 4B:
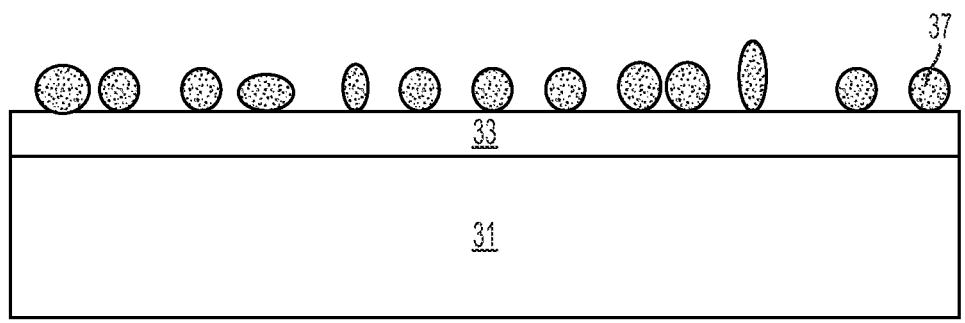
Figure 4C:
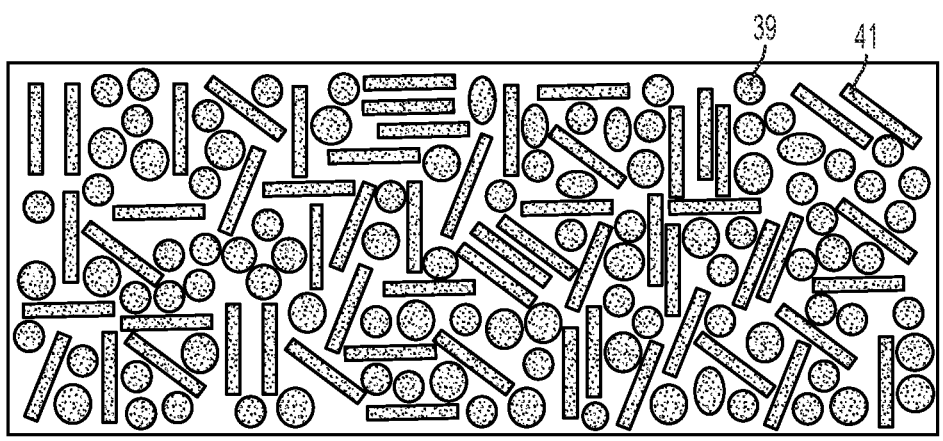

In operation 17 of FIG. 1, a layer of seed material is deposited on the dielectric adhesion layer. FIGS. 4A to 4C illustrate various embodiments of seed layer materials 35, 37, 39, and 41. FIG. 4A illustrates an embodiment where the seed layer materials 35 have a rounded shape and are about the same size. They are distributed on the dielectric adhesion layer with about 50% or better coverage. FIG. 4B illustrates another embodiment where the seed layer materials 37 have different shapes and have different sizes. In some embodiments, the seed layer material may be a mixture of rods and particles, some of different sizes deposited in a random pattern, as shown in FIG. 4C. FIG. 4C shows a top view of a portion of a partially fabricated LED after depositing the seed layer material.

The availability of source material can limit the size variation of the seed layer material. Generally, the seed layer materials may be single-crystal particles or rods and cover the surface of the dielectric adhesion layer with a 50% coverage or better. A suitable particle size may be about or greater than about 1 micron in average diameter with some variation from particle to particle. Acceptable variation may be from 500 nm to 10 microns or from 500 nm to 2 microns. The seed layer material is a single-crystal material suitable for epitaxially growing light-emitting structures. In other words, its lattice constant mismatch with gallium nitride must be small to allow single-crystal gallium nitride growth. Examples include gallium nitride, silicon carbide, or aluminum nitride. Note that while "average diameter" and "particle size" are used interchangeably in this disclosure, the single-crystal particles are not assumed to be spherical. The single-crystals have a Wurtzite crystal structure and, depending on the size of the particle, may have many faces along its crystal planes.

The seed layer material may be deposited on the dielectric adhesion layer in a number of ways. In one example, a liquid medium having the seed layer material mixed therein may be coated onto the dielectric adhesion layer by spin-coating, spraying, printing, or dipping. The seed layer materials may be suspended in the liquid medium, which may be viscous or not depending on the method of application. For example, a specific range of viscosity is suitable for spin-coating, but any viscosity may be used for printing. The concentration of the seed layer material in the liquid medium depends on the particle size and type. The concentration is chosen to achieve the desired surface coverage. In some embodiments, more than one application may be performed to achieve the desired surface coverage. The liquid medium may be a volatile fluid that can be easily evaporated by heating, leaving the solid seed layer material behind. The liquid medium may also be a material that readily dissociates when exposed to a reactive gas. In some embodiments, the seed layer material forms a colloid mixture with the liquid medium, from which a highly ordered seed layer may be formed.

In other embodiments, the seed layer material may be deposited separately from a glue layer. A glue layer may be deposited first and then exposed to seed layer particles. The glue layer is a material having a high affinity for the seed layer material. The surface of the seed layer material may be treated so that particles do not stick to each other (for example, because of van der Waals force) and that a portion of the material must be in contact with the glue layer for the seed layer material to stay. Additional material may be removed by blowing a gas across the top of the substrate. This way, a highly ordered single layer of seed layer material may be formed. Again the glue layer is removed by evaporation or reaction.

Figure 5:
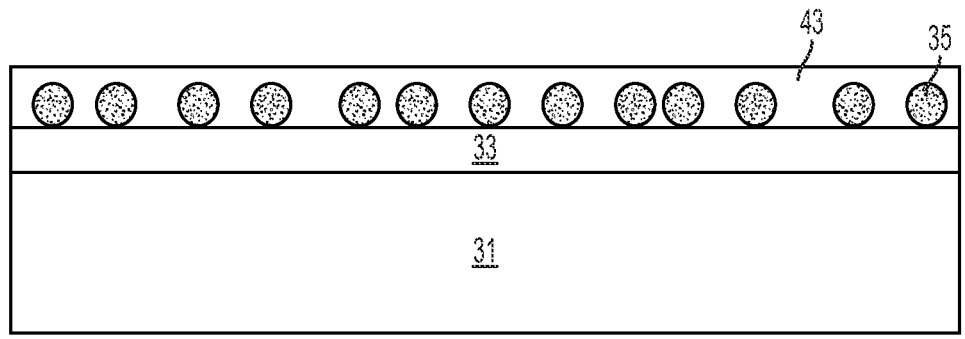

Referring back to FIG. 1, a second dielectric adhesion layer is deposited over and around the seed material layer in operation 19. The second dielectric adhesion layer is preferably the same material as the first dielectric adhesion layer, but can be a different material. The second dielectric adhesion layer should have good adhesion to the seed layer material and cover the seed layer material entirely with as little voids as possible, as shown in FIG. 5. A second dielectric adhesion layer 43 should form a contiguous layer with the first dielectric adhesion layer 33 so as to completely embed the seed layer materials 35. Thus, the second dielectric adhesion layer serves to fixate the seed layer material 35 on the first dielectric adhesion layer 33. The second dielectric adhesion layer may be deposited using processes by depositing a conformal oxide layer with high density and high quality oxide to better adhere to the first dielectric adhesion layer. An optional additional oxide material may be added using a different deposition technique to cover the seed layer materials.

Figure 6:
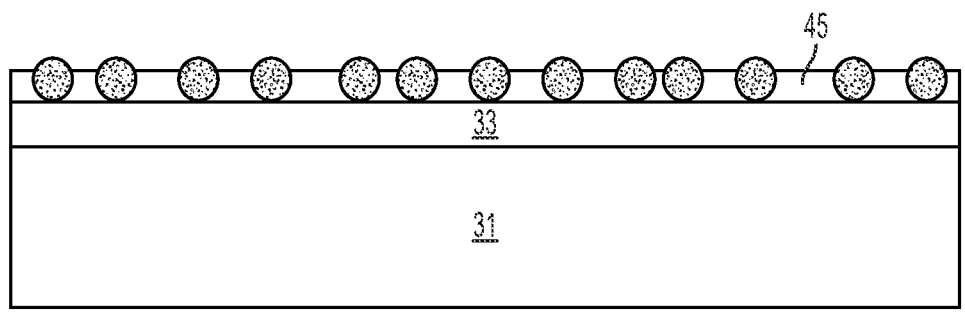

In operation 21, the second dielectric adhesion layer is etched to a thickness less than the average particle size of the seed material. The etch back partially exposes a substantial number of the seed layer material, but leaving enough second dielectric adhesion layer to keep the seed layer material embedded, forming a dielectric adhesion layer surface 45 as shown in FIG. 6. In some embodiments, substantially all of the seed layer material is partially exposed. An average surface area of the exposed surface of the seed layer may be greater than about 1 square micron. At this stage, the surface coverage of seed layer material relative to total area should be about 50%. In many embodiments, the surface coverage is better. The etch back also partially cleans the exposed surfaces to prepare the surface for epitaxially growing a light-emitting structure.

The etching may be a dry etch or a wet etch. A dry etch may include a reactive ion etch to remove a portion of the second dielectric adhesion layer, and may include bombardment to clean the seed layer material surface and to remove additional second dielectric adhesion layer so its thickness is smaller than an average particle diameter. A wet etch may be used to similar effects.

Figure 7:
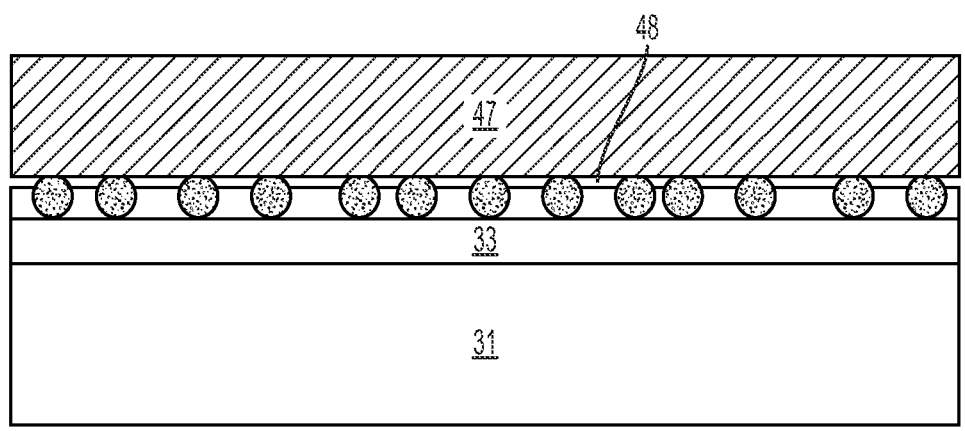

In operation 23, a group III-V semiconductor structure is epitaxially grown. The group III-V semiconductor structure includes a gallium nitride layer, which may be doped or undoped. Gallium nitride does not grow on the dielectric adhesion layer surface 45 and must grow from the exposed surfaces of the seed layer material 35 as shown in FIG. 7. According to various embodiments, the gallium nitride would form first on these exposed faces of the seed layer material and then laterally grow to close the gap between the seed layer material. As result, void 48 are likely to form between adjacent seed layer materials 35 above the second dielectric adhesion layer 33 and below the gallium nitride layer 47. In some embodiments, a free-standing gallium nitride layer, at a thickness of least about 100 microns is grown. Growing a gallium nitride layer of about 100 microns may take more than 8 hours using metallic organic chemical vapor deposition (MOCVD) or 1-2 hours using hybrid vapor phase epitaxy (HVPE), depending on process conditions. This free-standing gallium nitride layer is used as a growth substrate after it is removed from the first carrier substrate 31.

In other embodiments, the group III-V semiconductor structure includes a gallium nitride layer, or buffer layer, and a light-emitting structure. The light-emitting structure is formed over a gallium nitride/buffer layer. For forming a light-emitting structure, the gallium nitride layer need not be as thick as 100 microns and may not even have a defect free surface. The gallium nitride buffer layer, however, is about the same order of thickness as a buffer layer formed over a sapphire growth substrate if a gallium nitride seed layer is used. If an aluminum nitride seed layer is used, then the gallium nitride buffer layer may be thicker than a buffer layer formed over a sapphire growth substrate. The buffer layer may be about 100 nm to about 1 for example, about 1 µm.

In certain embodiments, the light-emitting structure includes a doped layer, a multiple quantum well layer (MQW), and another doped layer. The doped layers are oppositely doped semiconductor layers. In some embodiments, the first doped layer includes an n-type gallium nitride material, and the second doped layer includes a p-type gallium nitride material. In other embodiments, the first doped layer includes a p-type gallium nitride material, and the second doped layer includes an n-type gallium nitride material. The MQW layer includes alternating (or periodic) layers of active material, for example, gallium nitride and indium gallium nitride. As used herein, the active material in an LED is the primary source of light emission from an LED during operation. For example, in one embodiment, the MQW layer includes ten layers of gallium nitride and ten layers of indium gallium nitride, where an indium gallium nitride layer is formed on a gallium nitride layer, and another gallium nitride layer is formed on the indium gallium nitride layer, and so on and so forth. The number of layers of alternating layers and their thicknesses affect the light emission efficiency. The thickness of the MQW layer may be, for example, about 100-2000 nm, 200 nm, or about 1 µm.

The doping may be accomplished by adding impurities into a source gas during the epitaxial growth processes. During the epitaxial growth processes, a p-n junction (or a p-n diode) including the MQW layer between the oppositely doped layers is formed. When an electrical voltage is applied, an electrical current flows through the light-emitting structure and the MQW layer emits radiation. The color of the light emitted by the MQW layer is associated with the wavelength of the emitted radiation, which may be tuned by varying the composition and structure of the materials that make up the MQW layer. For example, a small increase in the concentration of indium in the indium gallium nitride layer is associated with a shift of the wavelength output toward longer wavelengths.

The operation of forming a light-emitting structure may optionally include the formation of additional layers. For example, an ohmic contact layer or other layers may be added on the second doped layer. These other layers may include an indium tin oxide (ITO) layer, or another transparent conductive layer.

Figure 8:
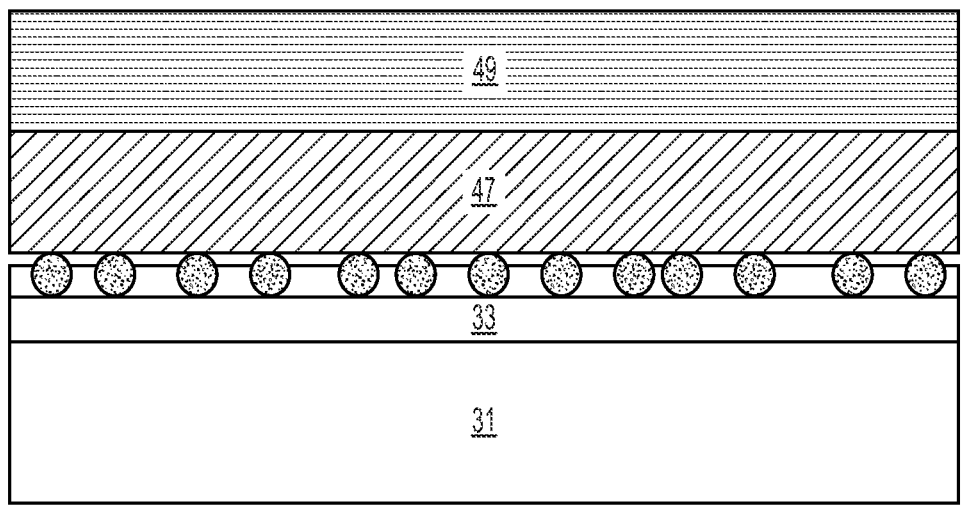

If the group III-V semiconductor structure is not thick enough to be a free-standing structure (at least about 100 microns), then a second carrier substrate is bonded to the group III-V semiconductor structure on an opposite side from the first carrier substrate in operation 25 of FIG. 1. FIG. 8 illustrates a second carrier substrate 49 bonded to the group III-V semiconductor structure 47. The second carrier substrate 49 may be a silicon substrate, ceramic substrate, or a metal containing substrate such as a metal substrate or a metal core printed circuit board (MCPCB). The second carrier substrate 49 is commonly a packaging substrate and will remain with the packaged LED product. In some embodiments, the second carrier substrate 49 includes circuitry printed or embedded thereon. Embedded circuitry may include through substrate vias (TSVs) that electrically connect the group III-V semiconductor structure to terminals (not shown) on a non-bonded side of the second carrier substrate 49.

The second carrier substrate 49 may be bonded to the group III-V semiconductor structure in a number of ways. If circuitry is included, the bonding may be a eutectic bond or a metal bond with one or more bonding metal layers, one on the second carrier substrate and one on the group III-V semiconductor structure. For eutectic bonding, the bonding metal layers may be a gold/tin alloy and gold. For metal bonding, the bonding metal layers may be gold. Alternatives to metal-to-metal bonding include using a conductive glue, epoxy, or resin. Most common conductive adhesives include metallic particles such as silver in various concentrations depending on required electrical conductivity. After applying the adhesive, the metallic particles form a conductive network that may sufficiently support the power requirements for the LED package. However, electrically conductive adhesives may limit thermal conduction and may not be suitable for high power applications.

If the group III-V semiconductor structure is free-standing, then the bonding operation 25 is optional. A free-standing group III-V semiconductor structure may or may not include a light-emitting structure. If a light-emitting structure is not included, then the product after removing the first carrier substrate is a gallium nitride substrate suitable for making optoelectronic devices including LEDs.

To promote good electrical contact, light extraction, and efficient cooling of the LED during operation, the growth substrate is removed in many LED products, especially for high power LEDs. In one example, an interface between the growth substrate and the buffer layer is destroyed with electromagnetic radiation (for example, an excimer laser), which decomposes the buffer material at the interface. The growth substrate, for example, sapphire, may be lifted off and removed. In this laser lift-off (LLO) method, a laser beam generated by an excimer laser is injected from the sapphire side into the light-emitting structure to decompose the gallium nitride material at the interface between the substrate and the buffer layer to gallium atoms and nitrogen gas.

One particular feature of the LLO method is that in many cases the sapphire removed may be recycled for a limited number of times and used again as a growth substrate after polishing. However, the LLO process generally uses high laser power density to decompose the gallium nitride at the buffer layer/substrate interface. The laser spot is usually set to the LED die size to ensure a clean lift-off. As the growth substrates increase in size, more and more LED dies are grown on the same substrate, which increases the LLO process time as the laser moves from spot to spot (die to die). To ensure the entire substrate may be removed, the laser spot overlaps slightly at the edge. However, the high power density is very destructive and cracks can form at the edge of each overlapped laser spot as a result. The laser would damage exposed surface and sidewalls of the light-emitting structure. These cracks and damages can cause current leakage during operation.

Figure 9:
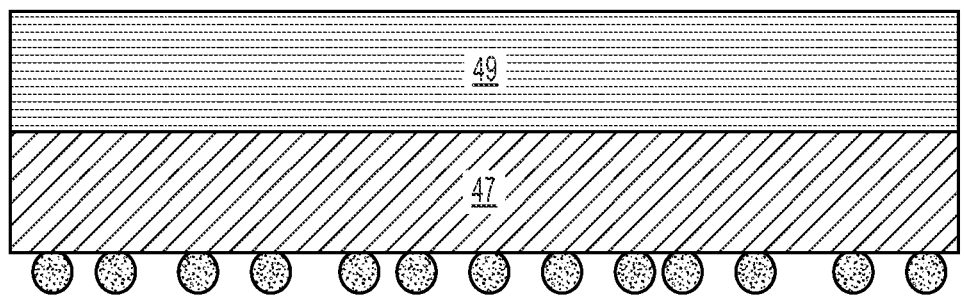

One aspect of the present disclosure pertains to a method of removing the first carrier substrate that does not include the use of a laser beam and therefore also does not include any of the attendant issues. Referring back to FIG. 1, in operation 27, the first and second dielectric adhesion layers are etched away in a wet etch to detach the first carrier substrate. FIG. 9 illustrates the as-detached configuration of the first carrier substrate 31 and the group III-V semiconductor structure 47 with seed layer materials on one side and the second carrier substrate 49 on the other side.

Depending on the material selected for the first and second dielectric adhesion layer, different wet etch chemistries may be used. The wet etch chemistry is selected to aggressively etch the first and second dielectric adhesion layer materials without significantly etching the first carrier substrate 31 or the group III-V semiconductor structure 47. Because the wet etch would occur laterally and may be diffusion-limited at the center of the substrate, an aggressive etcher is used. For example, hydrofluoric acid (HF) is a known aggressive etcher of silicon oxide and has a very low etch rate of silicon and the group III-V semiconductor structure. The HF wet etch may be buffered to better control the etch rate. The wet etch can take many hours, e.g., more than four or about 6-10 hours.

In some embodiments, the wet etch may be enhanced by cutting through a portion of either side of the partially fabricated LED to expose the first and second dielectric adhesion layer to the etchant. The etch time is dramatically improved. The wet etch may be reduced to the order of about one hour. Note that if the laser scribing occurs through the first carrier substrate side, the first carrier substrate would be rendered non-recyclable.

In still other embodiments, the first carrier substrate may include through substrate vias (TSVs) that provide wet etchant access to the first dielectric adhesion layer. The TSVs may be apportioned to locate at LED die boundaries and are pre-drilled on the first carrier substrate. During the first dielectric adhesion layer deposition, a non-conformal layer is used for the blanket deposition so as not to plug the TSVs. During the wet etch, etchants attack the first and second dielectric adhesion layer from the edges of the substrates as well as from the TSVs. The wet etchant may be agitated during the process to further improve diffusion.

Figure 10:
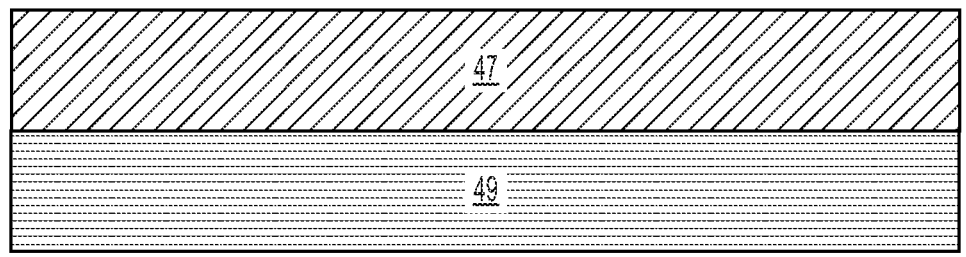

Referring back to FIG. 1, a bottom surface of the group III-V semiconductor structure may be planarized in operation 29. The group III-V semiconductor structure as separated from the first carrier substrate includes the seed layer particles from which the group III-V semiconductor structure is grown. The seed layer particles may be removed, resulting in the structure as illustrated in FIG. 10 having the second carrier substrate 49 and the group III-V semiconductor structure 47.

The planarization may be performed by inductively coupled plasma (ICP) dry etch, chemical mechanical polishing (CMP) or a combination of these and/or other etching operations. Because the portion of the group III-V semiconductor structure closest to the seed layer material is more likely to have defects, the planarization operation can remove more than the seed layer material and thereby removing some defects. ICP dry etch comprises plasma using reactive gaseous, for example, $Cl_2$, $BCl_3$ and $CH_2Cl_2$. Suitable CMP processes are similar to those used to polish sapphire substrates for recycling.

In some embodiments, the planarizing operation is optional. The patterned surface may be used as a diffuser in the LED package. In some cases, electrodes for one of the p-n junctions may be deposited directly on the seed layer materials.

After planarization, various package processes may be performed to form a final emitter product. The packaging processes may include making electrical connections to terminals on the packaging substrate and adding various optical elements to the package including lenses, phosphors, encapsulants, and reflectors.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a light-emitting diode (LED), comprising:
   providing a first carrier substrate; depositing a first dielectric adhesion layer;
   depositing a layer of seed material, wherein the seed material comprises gallium nitride, silicon carbide, or aluminum nitride;
   depositing a second dielectric adhesion layer over and around the layer of seed material;
   etching the second dielectric adhesion layer to a thickness less than the average particle size of the seed material;
   epitaxially growing a group III-V semiconductor structure;
   bonding a second carrier substrate to the group III-V semiconductor structure; and,
   wet etching the first and second dielectric adhesion layers to detach the first carrier substrate.

2. The method of claim 1, further comprising planarizing a bottom surface of the group III-V semiconductor structure.

3. The method of claim 2, wherein the planarizing a bottom surface comprises dry etching.

4. The method of claim 1, wherein the epitaxially growing a group III-V semiconductor structure comprises:
   growing a first doped layer doped with a first impurity of a first conductivity type;
   growing an active layer over the first doped layer; and
   growing a second doped layer over the active layer, the second doped layer doped with a second impurity of a second conductivity type opposite the first conductivity type.

5. The method of claim 4, wherein the bonding a second carrier substrate comprises applying glue between the second carrier substrate and the group III-V semiconductor structure or metal bonding the second carrier substrate and the group III-V semiconductor structure.

6. The method of claim 1, wherein the seed material comprises fine particles or rods.

7. The method of claim 6, wherein the fine particles are powder with an average diameter of less than about 10 microns.

8. The method of claim 1, wherein the seed material comprises a number of small crystals and wherein the etching the second dielectric adhesion layer exposes a surface of a substantial number of the small crystals.

9. The method of claim 8, wherein an average surface area of the exposed surfaces of the substantial number of the small crystals is greater than about 1 square micron.

10. The method of claim 1, wherein the seed material covers at least 50% of a top surface of the first dielectric adhesion layer.

11. The method of claim 1, wherein the seed material is deposited by applying a liquid medium having the seed material mixed therein to the first dielectric adhesion layer and then evaporating the liquid medium.

12. The method of claim 1, wherein the detached first carrier substrate is reused in a subsequent LED fabricating method as a first carrier substrate.

13. The method of claim 1, wherein the first carrier substrate is silicon.

14. The method of claim 1, wherein the wet etching comprising immersing in an etching solution including hydrofluoric acid.

15. A method of fabricating a light-emitting diode (LED), comprising:
providing a carrier substrate;
depositing a first dielectric adhesion layer;
depositing a layer of seed material, wherein the seed material comprises gallium nitride, silicon carbide, or aluminum nitride;
depositing a second dielectric adhesion layer over and around the layer of seed material;
etching the second dielectric adhesion layer to a thickness less than the average particle size of the seed material;
epitaxially growing a gallium nitride layer, wherein a total thickness of the gallium nitride layer is more than about 100 microns; and,
wet etching the first and second dielectric adhesion layers to detach the carrier substrate from the gallium nitride layer.

16. The method of claim 15, further comprising planarizing a bottom surface of the gallium nitride layer.

17. The method of claim 15, further comprising growing a light-emitting structure, said light-emitting structure comprises a first doped layer doped with a first impurity of a first conductivity type; an active layer over the first doped layer; and a second doped layer over the active layer, the second doped layer doped with a second impurity of a second conductivity type opposite the first conductivity type.

18. The method of claim 15, wherein the seed material comprises particles or rods.

19. A method comprising:
depositing a first dielectric adhesion layer over a substrate;
depositing a layer of seed material over the first dielectric adhesion layer, wherein the seed material comprises gallium nitride, silicon carbide, or aluminum nitride;
depositing a second dielectric adhesion layer over the layer of seed material;
etching the second dielectric adhesion layer to expose a portion of the layer of seed material;
forming a group III-V semiconductor structure over the portion of the layer of seed material; and
removing the first and second dielectric adhesion layers to detach the first carrier substrate.

20. The method of claim 19, wherein removing the first and second dielectric adhesion layers to detach the first carrier substrate includes etching the first and second dielectric adhesion layers to detach the first carrier substrate.

* * * * *